US 8,432,188 B2

(12) United States Patent
Jung et al.

(10) Patent No.: US 8,432,188 B2
(45) Date of Patent: Apr. 30, 2013

(54) LATCH CIRCUIT, FLIP-FLOP HAVING THE SAME AND DATA LATCHING METHOD

(75) Inventors: Gunok Jung, Yongin-si (KR); Minsu Kim, Hwaseong-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 13/291,435

(22) Filed: Nov. 8, 2011

(65) Prior Publication Data

US 2012/0119783 A1  May 17, 2012

(30) Foreign Application Priority Data

Nov. 11, 2010 (KR) .................. 10-2010-0112256

(51) Int. Cl.
*H03K 19/00* (2006.01)
(52) U.S. Cl.
USPC ............. 326/58; 326/34; 326/113; 327/57; 327/166; 327/176
(58) Field of Classification Search .............. 326/31, 326/34, 56–58, 112–113; 327/57, 166, 176
See application file for complete search history.

(56) References Cited

U.S. PATENT DOCUMENTS

| | | | | |
|---|---|---|---|---|
| 5,459,421 A | * | 10/1995 | Shaw | 327/203 |
| 6,087,886 A | * | 7/2000 | Ko | 327/408 |
| 6,646,464 B2 | * | 11/2003 | Maruyama | 326/35 |
| 6,803,799 B1 | * | 10/2004 | Churchill et al. | 327/202 |
| 7,948,263 B2 | * | 5/2011 | Kim et al. | 326/33 |
| 2003/0218231 A1 | * | 11/2003 | Sani et al. | 257/500 |
| 2004/0061135 A1 | * | 4/2004 | Ikeno et al. | 257/200 |
| 2004/0119505 A1 | * | 6/2004 | Ryan | 326/112 |
| 2005/0104133 A1 | * | 5/2005 | Kanno et al. | 257/371 |
| 2006/0220700 A1 | * | 10/2006 | Hoover et al. | 327/108 |
| 2007/0132495 A1 | * | 6/2007 | Yang et al. | 327/218 |
| 2009/0058485 A1 | * | 3/2009 | Berzins et al. | 327/203 |
| 2009/0256609 A1 | * | 10/2009 | Naffziger | 327/203 |

FOREIGN PATENT DOCUMENTS

| | | |
|---|---|---|
| JP | 01-123517 A | 5/1989 |
| JP | 04-154207 A | 5/1992 |
| JP | 04-192911 A | 7/1992 |
| JP | 06 350408 A | 12/1994 |

* cited by examiner

*Primary Examiner* — Jason M Crawford
(74) *Attorney, Agent, or Firm* — Lee & Morse, P.C.

(57) ABSTRACT

A latch circuit includes a first tri-state inverter configured to invert an input voltage in response to a pulse and to output the inverted voltage to a first node, a second tri-state inverter connected between the first node and a second node and to invert a voltage of the second node in response to an inverted pulse being an inverted version of the pulse, and a variable inversion unit connected between the first node and the second node. The variable inversion unit adjusts a logical threshold value according to a logical value corresponding to a voltage of the first node and inverts a voltage of the first node based upon the adjusted logical threshold value, the logical threshold value indicating a voltage for discriminating the logical value.

20 Claims, 13 Drawing Sheets

LATCH CIRCUIT, FLIP-FLOP HAVING THE SAME AND DATA LATCHING METHOD

CROSS-REFERENCE TO RELATED APPLICATIONS

This application claims the benefits, under 35 U.S.C §119, of Korean Patent Application No. 10-2010-0112256 filed Nov. 11, 2010, the entirety of which is incorporated by reference herein.

BACKGROUND

1. Field

Embodiments relate to a latch circuit, a flip-flop including the same, and a data latching method.

2. Description of the Related Art

Flip-flops may be a general-purpose data storage element. Flip-flops may be important components of digital circuit design. Flip-flops may be clocked storage elements that enable sequential and stable logic design. flip-flops may be used to store logic states, parameters, or digital control signals.

For example, microprocessors may typically include a plurality of flip-flops. Flip-flops can provide a maximum logic clocking speed by reducing a clock-to-output time and a setup and hold time. This may be to coincide with an operation of a high-performance microprocessor. Further, flip-flops can reduce a data response time by reducing a data-to-clock time.

SUMMARY

One or more embodiments of a latch circuit may be configured to adjust a logical threshold value LTV based on a logical value that is adjusted in view of a noise margin.

One or more embodiments provide a latch circuit including a first tri-state inverter configured to invert an input voltage in response to a pulse and to output the inverted voltage to a first node; a second tri-state inverter connected between the first node and a second node and to invert a voltage of the second node in response to an inverted pulse being an inverted version of the pulse; a variable inversion unit connected between the first node and the second node, wherein the variable inversion unit adjusts a logical threshold value according to a logical value corresponding to a voltage of the first node and inverts a voltage of the first node based upon the adjusted logical threshold value, the logical threshold value indicating a voltage for discriminating the logical value.

The second tri-state inverter may be turned off when the first tri-state inverter is turned on, and the second tri-state inverter may be turned on when the first tri-state inverter is turned off.

The second tri-state inverter may include an inverter connected between the second node and a third node and configured to invert a voltage of the second node, and a tri-state transmission gate connected between the first node and the third node and configured to output a voltage of the third node to the first node in response to the inverted pulse.

The logical threshold value may be increased over a reference value when a voltage of the first node corresponds to a logical value of '0' and may be lowered below the reference value when a voltage of the first node corresponds to a logical value of '1'.

The reference value may be half a power supply voltage.

The variable inversion unit may include at least one PMOS transistor and at least one NMOS transistor, the at least one PMOS transistor and the at least one NMOS transistor being formed to invert the logical value, and the logical threshold value may be adjusted according to a ratio of a driving ability of the at least one PMOS transistor to a driving ability of the at least one NMOS transistor.

The variable inversion unit may include a first PMOS transistor and a first NMOS transistor connected in series between a power supply voltage and a ground voltage, the first PMOS transistor being connected between the power supply voltage and the second node, the first NMOS transistor being connected between the second node and the ground voltage, and gates of the first PMOS transistor and the first NMOS transistor being connected with the first node, and a second PMOS transistor, a third PMOS transistor, a second NMOS transistor, and a third NMOS transistor connected in series between the power supply voltage and the ground voltage, the second and third PMOS transistors being connected in series between the power supply voltage and the second node, the second and third NMOS transistors being connected in series between the second node and the ground voltage, gates of the second PMOS transistor and the second NMOS transistor being connected with the first node, and gates of the third PMOS transistor and the third NMOS transistor being connected with the third node.

Channel widths of the first to third PMOS transistors may be wider than those of the first to third NMOS transistors.

The first PMOS transistor may have a channel width of 0.24 µm, each of the second and third PMOS transistors may have a channel width of 0.70 µm, the first NMOS transistor may have a channel width of 0.12 µm, and each of the second and third NMOS transistors may have a channel width of 0.35 µm.

The inverter may include a PMOS transistor connected between the power supply voltage and the third node; and an NMOS transistor connected between the third node and the ground voltage, gates of the PMOS and NMOS transistors being connected with the first node, and the PMOS and NMOS transistors having the same channel width.

In one or more embodiments, each of the PMOS and NMOS transistors may have a channel width of 0.12 µm.

The variable inversion unit may include a first PMOS transistor and a first NMOS transistor connected in series between a power supply voltage and a ground voltage, the first PMOS transistor being connected between the power supply voltage and the second node, the first NMOS transistor being connected between the second node and the ground voltage, and gates of the first PMOS transistor and the first NMOS transistor being connected with the first node; and a second PMOS transistor, a third PMOS transistor, a second NMOS transistor, and a third NMOS transistor connected in series between the power supply voltage and the ground voltage, the second and third PMOS transistors being connected in series between the power supply voltage and the second node, the second and third NMOS transistors being connected in series between the second node and the ground voltage, gates of the second PMOS transistor and the second NMOS transistor being connected with the third node, and gates of the third PMOS transistor and the third NMOS transistor being connected with the first node.

One or more embodiments provides a flip-flop including a clock generator configured to generate a pulse in response to a clock; and a latch circuit configured to latch input data in response to the pulse, wherein at a latch operation, the latch circuit adjusts a logical threshold value according to the input data and inverts the input data based upon the adjusted logical threshold value, the logical threshold value directing a voltage for discriminating the logical value.

The latch circuit may include a first tri-state inverter configured to invert the input data in response to the pulse; a second tri-state inverter configured to invert an output of the first tri-state inverter in response to an inverted pulse being an inverted version of the pulse; and a variable inversion unit configured to adjust the logical threshold value according to the logical value corresponding to an output of the first tri-state inverter and to invert the logical value based upon the adjusted logical threshold value.

The second tri-state inverter may include an inverter configured to invert an output of the variable inversion unit; and a tri-state transmission gate configured to output an output of the inverter in response to the inverted pulse.

The variable inversion unit may include a first PMOS transistor connected between a power supply voltage and a second node; second and third PMOS transistors connected in series between the power supply voltage and the second node; a first NMOS transistor connected between the second node and a ground voltage; and second and third NMOS transistors connected in series between the second node and the ground voltage, wherein gates of the first PMOS transistor, the third PMOS transistor, the first NMOS transistor, and the second NMOS transistor are connected with the first node and gates of the second PMOS transistor and the third NMOS transistor are connected with a third node, and wherein the first node is an output terminal of the first tri-state inverter, the second node is an input terminal of the inverter, and the third node is an output terminal of the inverter.

The variable inversion unit may include a first PMOS transistor connected between a power supply voltage and a second node; second and third PMOS transistors connected in series between the power supply voltage and the second node; a first NMOS transistor connected between the second node and a ground voltage; and second and third NMOS transistors connected in series between the second node and the ground voltage, wherein gates of the first PMOS transistor, the second PMOS transistor, the first NMOS transistor, and the third NMOS transistor are connected with the first node and gates of the third PMOS transistor and the second NMOS transistor are connected with a third node, and wherein the first node is an output terminal of the first tri-state inverter, the second node is an input terminal of the inverter, and the third node is an output terminal of the inverter.

In this embodiment, the clock generator may include a delay circuit configured to delay the clock and including a plurality of inverters the number of which is odd; a logical circuit configured to make a NAND operation on the clock and an output of the delay circuit, and an inverter configured to invert an output of the logical circuit, wherein an output of the logical circuit is the pulse.

One or more embodiments provide a data latching method which comprises receiving data; inverting the input data in response to a pulse; adjusting a logical threshold value according to the inverted data, the logical threshold voltage directing a voltage for discriminating the logical value In one or more embodiments, adjusting may include increasing the logical threshold value over a reference value when the inverted data is '0'; and lowering the logical threshold value below the reference value when the inverted data is '1'.

One or more embodiments provide a latch circuit, including a first tri-state inverter configured to input a voltage and output the inverted voltage to a first node, and a variable inversion unit including a plurality of PMOS transistors and a plurality of NMOS transistors, the variable inversion unit being configured to adjust a logical threshold value based on a logical value of a voltage at the first node based on a driving-ability ratio of the PMOS and NMOS transistors, and to invert a voltage the first node based on the adjusted logical threshold value, the logical threshold value corresponding to a threshold voltage value for determining a logical value of a voltage.

BRIEF DESCRIPTION OF THE DRAWINGS

Features will become more apparent to those of ordinary skill in the art by describing in detail exemplary embodiments with reference to the attached drawings, in which.

DETAILED DESCRIPTION

Figure 1:
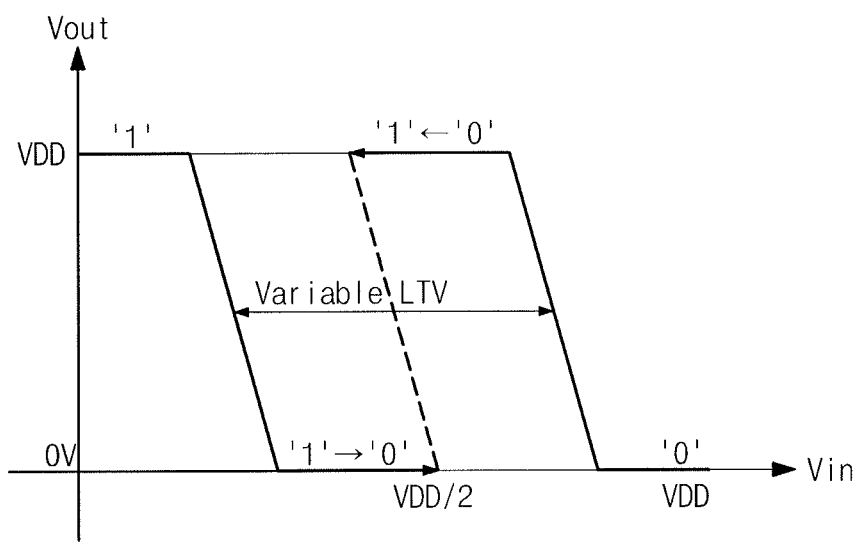
FIG. 1 illustrates a graph of exemplary voltage states of an exemplary embodiment of a latch circuit.

Korean Patent Application No. 10-2010-0112256 filed on Nov. 11, 2010, in the Korean Intellectual Property Office, and entitled: "Latch Circuit, Flip-Flop Having the Same and Data Latching Method," is incorporated by reference herein in its entirety.

Exemplary embodiments are described more fully hereinafter with reference to the accompanying drawings, in which embodiments of the inventive concept are shown. This inventive concept may, however, be embodied in many different forms and should not be construed as limited to the embodiments set forth herein. Rather, these embodiments are provided so that this disclosure will be thorough and complete, and will fully convey the scope of the inventive concept to those skilled in the art. In the drawings, the size and relative sizes of layers and regions may be exaggerated for clarity. Like numbers refer to like elements throughout.

One or more embodiments of a latch circuit may be configured to adjust a logical threshold value LTV based on a logical value that is adjusted in view of a noise margin.

FIG. 1 illustrates a graph of voltage states of an exemplary embodiment of a latch circuit. Referring to FIG. 1, when a changed logical value is '0', that is, when a logical value is transitioned from '0' to '1', a logical threshold value LTV may be set to be higher than VDD/2. When a changed logical value is '1', that is, when a logical value is transitioned from '1' to '0', the logical threshold value LTV may be set to be lower than VDD/2. Transitioning a logical value from '0' to '1' may be named 'rising,' and transitioning a logical value from '1' to '0' may be named 'falling'.

In one or more embodiments, when a changed logical value is '0', the logical threshold value LTV may be increased to be, e.g., higher than VDD/2 such that a logical value is not easily changed due to noise. In one or more embodiments, when a changed logical value is '1', the logical threshold value LTV may be decreased to be lower than VDD/2 such that a logical value is not easily changed due to noise.

The logical threshold voltage LTV may be closely associated with a ratio of a driving-ability of a PMOS transistor and a driving-ability of an NMOS transistor. The PMOS and NMOS transistors may be formed to invert a logical value. The logical threshold value LTV may be adjusted by adjusting the driving-ability ratio. One or more embodiments of a latch circuit may be configured to adjust the logical threshold value LTV by adjusting the ratio of driving-abilities of transistors according to a changed logical value. Herein, transistors may be used to invert a changed logical value.

Figure 2:
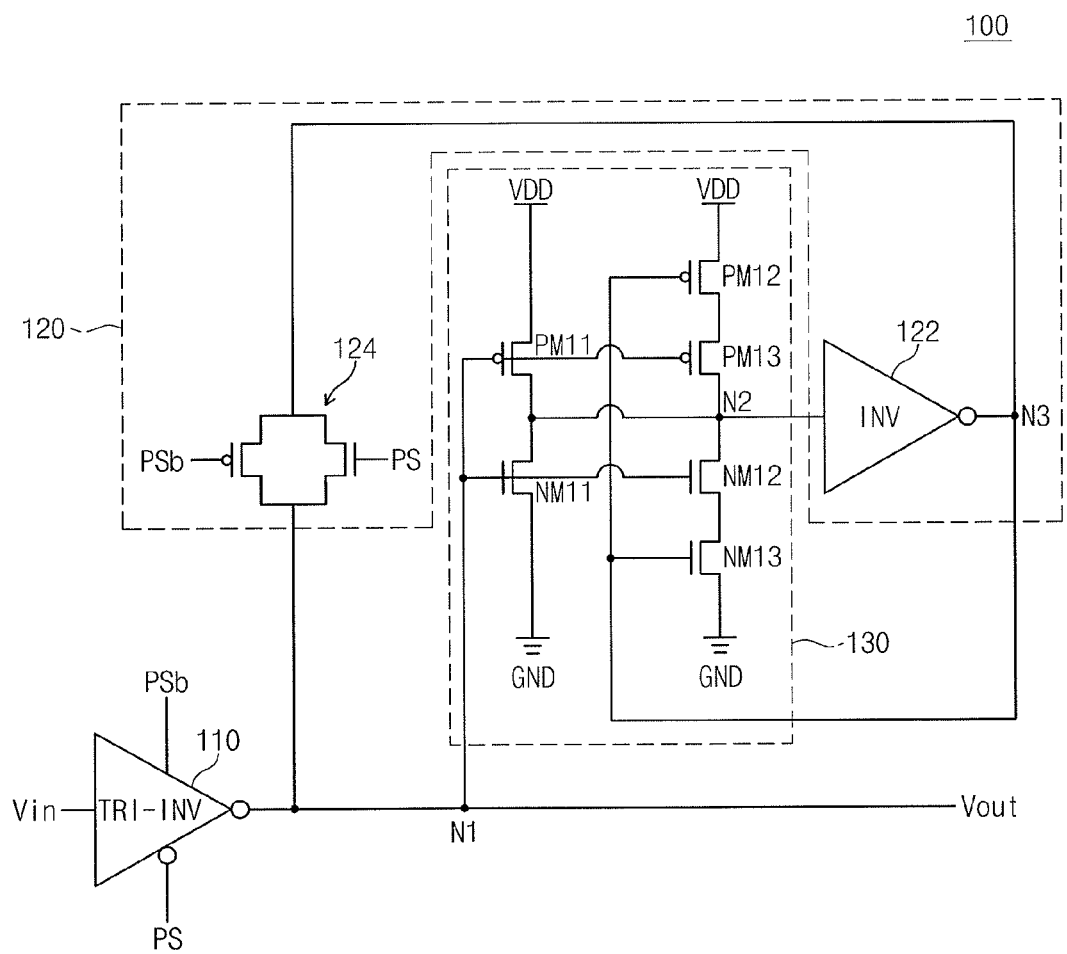
FIG. 2 illustrates a schematic diagram of an exemplary embodiment of a latch circuit.

FIG. 2 illustrates a diagram of an exemplary embodiment of a latch circuit 100. Referring to FIG. 2, the latch circuit 100 may include a first tri-state inverter 110, a second tri-state inverter 120, and a variable inversion unit 130.

The first tri-state inverter 110 may invert an input voltage Vin in response to an inverted pulse PSb and may output an inverted voltage (inverted Vin voltage) to the first node N1. The first tri-state inverter 110 may be turned on in response to a high level of the inverted pulse PSb.

The second tri-state inverter 120 may be connected between the first node N1 and a second node N2. The second tri-state inverter 120 may invert a voltage of the second node N2 in response to a pulse PS to output the inverted voltage to the first node N1. The second tri-state inverter 120 may be turned off in response to a high level of the inverted pulse PSb. That is, when the first tri-state inverter 110 is turned on, the second tri-state inverter 120 may be turned off. When the first tri-state inverter 110 is turned off, the second tri-state inverter 120 may be turned on.

The second tri-state inverter 120 may include an inverter 122 and a tri-state transmission gate 124. The inverter 122 may invert a voltage of the second node N2 and may output the inverted voltage of the second node N2 to the third node N3. Although not shown in FIG. 3, the inverter 122 may include a PMOS transistor and an NMOS transistor connected in series between a power supply voltage VDD and a ground voltage GND. The PMOS and NMOS transistors of the inverter 122 may have gates connected in common with the second node N2. In one or more embodiments, a channel width of the PMOS transistor may be identical to that of the NMOS transistor, e.g., each of the PMOS and NMOS transistors may have a channel width of 0.12 μm.

The tri-state transmission gate 124 may transfer a voltage of a third node N3 to the first node N1 in response to a high level of the pulse PS. That is, the tri-state transmission gate 124 may be turned on in response to a high level of the pulse PS. When the first tri-state inverter 110 is turned on in response to a high level of the inverted pulse PSb, the tri-state transmission gate 124 may be turned off in response to a high level of the inverted pulse PSb.

The variable inversion unit 130 may invert a voltage of the first node N1 and may output the inverted voltage of the first node N1 to the second node N2. Herein, the variable inversion unit 130 may be configured to adjust a logical threshold value LTV by adjusting a ratio of a driving ability of a PMOS transistor to a driving ability of an NMOS transistor according to a voltage of the first node N1, that is, a changed logical value ('1' or '0'). In particular, the variable inversion unit 130 may be configured to control the number of transistors simultaneously driven according to a changed logical value, so that a driving ability ratio is adjusted.

The variable inversion unit 130 may include a plurality of PMOS transistors and a plurality of NMOS transistors. Two or more the PMOS transistors and/or two or more of the NMOS transistors may be stacked together. Referring to the exemplary embodiment of FIG. 2, the variable inversion unit 130 may include first, second, and third PMOS transistors PM11, PM12, and PM13 and first, second, and third NMOS transistors NM11, NM12, and NM13.

The first PMOS transistor PM11 and the first NMOS transistor NM11 may be connected in series between a power supply voltage VDD and a ground voltage GND. The first PMOS transistor PM11 may be connected between a power supply voltage VDD and the second node N2, and the first NMOS transistor NM11 may be connected between the second node N2 and a ground voltage GND. Gates of the first PMOS transistor PM11 and the first NMOS transistor NM11 may be connected with the first node.

In one or more embodiments, a channel width of the first PMOS transistor PM11 may be wider than that of the first NMOS transistor NM11. In one or more embodiments, a channel width of the first PMOS transistor PM11 may be twice as wide as that of the first NMOS transistor NM11. For example, the first PMOS transistor PM11 may have a channel width of 0.24 μm, and the first NMOS transistor NM11 may have a channel width of 0.12 μm.

The transistors, e.g., PM12, PM13, NM12, NM13 may be connected in series between a power supply voltage VDD and a ground voltage GND to form a stack shape. The second and third PMOS transistors PM12, PM13 may be connected in series between a power supply voltage VDD and the second node N2, and the second and third NMOS transistors NM12, NM13 may be connected in series between the second node N2 and a ground voltage GND. Gates of the transistors PM13, NM12 may be connected with the first node N1, and gates of the transistors PM12, NM13 may be connected with the third node N3.

In one or more embodiments, channel widths of the transistors PM12, 13 may be wider than those of the transistors NM12, NM13. In an exemplary embodiment, the channel widths of the transistors PM12, PM13 may be twice as wide as those of the transistors NM12, NM13. For example, the second and third PMOS transistors PM12, PM13 may have a channel width of 0.70 μm, respectively, and the second and third NMOS transistors NM12, NM13 may have a channel width of 0.35 μm, respectively.

A latch operation of one or more embodiments of the latch circuit 100 of FIG. 2 may have a reduced latch time relative to conventional latches by eliminating one or more gates or devices, e.g., utilizing one or more fewer gates relative to conventional latches, so as to reduce a gate delay time. Further, one or more embodiments of the latch circuit 100 may have an improved latch speed compared to conventional latch circuits, e.g., general latch circuit 10 of FIG. 13.

Further, one or more embodiments of a latch circuit employing one or more features described herein, e.g., the latch circuit 100, may be configured to adjust a logical threshold value LTV according to a logical value that is varied in view of a noise margin.

Below, an exemplary embodiment of a latch operation of the latch circuit 100 of FIG. 2 will be described.

It is assumed that an input voltage Vin is a voltage (e.g., a ground voltage GND) corresponding to a logical value of '0'. In response to a high level of an inverted pulse PBb, the first tri-state inverter 110 may invert the input voltage Vin to output it to the first node N1. At this time, a voltage of the first node N1 may be a power supply voltage VDD corresponding to a logical value of '1'.

The variable inversion unit 130 may receive the power supply voltage VDD corresponding to a logical value of '1' and may adjust a logical threshold value LTV for discriminating a variation of a logical value from '1' to '0'. This may be accomplished by adjusting a ratio of a driving ability of PMOS transistors PM11, PM12, PM13 to a driving ability of NMOS transistors NM11, NM12, NM13. For example, the variable inversion unit 130 may halve the logical threshold value LTV for discriminating a variation of a logical value from '1' to '0', by driving selective ones of the PMOS and NMOS transistors PM11, PM12, PM12, NM11, NM12, NM13. More particularly, e.g., for discriminating a variation of a logical value from '1' to '0', the variable inversion unit 130 may drive one PMOS transistor PM11 and three NMOS transistors NM11, NM12, and NM13 during an inversion procedure. As such, the logical threshold value LTV may be lowered to VDD/2.

The variable inversion unit 130 may invert the power supply voltage VDD corresponding to a logical value of '1' to a ground voltage GND corresponding to a logical value of '0' according to the adjusted, e.g., lowered, logical threshold value LTV, and may output the inverted voltage to the second node N2. The inverter 122 may invert a voltage of the second node N2, that is, the ground voltage GND to the power supply voltage VDD and may output the inverted voltage of the second node N2 to the third node N3. A voltage of the third node N3, that is, the power supply voltage VDD may be transferred to the first node N1 in response to a low level of the inverted pulse PSb. Accordingly, the first node N1 may latch a logical value of '1' corresponding to the power supply voltage VDD. The latched voltage may correspond to an output voltage Vout.

It is now assumed that the input voltage Vin is a voltage (e.g., the power supply voltage VDD) corresponding to a logical value of '1'. In response to a high level of the inverted pulse PSb, the first tri-state inverter 110 may invert the input voltage Vin and may output it to the first node N1. At this time, a voltage of the first node N1 may be the ground voltage GND corresponding to a logical value of '0'.

The variable inversion unit 130 may receive the ground voltage GND corresponding to a logical value of '0' and may adjust a logical threshold value LTV for discriminating a variation of a logical value from '0' to '1'. This may be accomplished by adjusting a ratio of a driving ability of the PMOS transistors PM11, PM12, PM13 to a driving ability of the NMOS transistor NM11, NM12, NM13. For example, the variable inversion unit 130 may adjust, e.g., increase, the logical threshold value LTV for discriminating a variation of a logical value from '0' to '1' by VDD/2, by driving selective ones of the PMOS and NMOS transistors, e.g., driving three PMOS transistors PM11, PM12, and PM13 and one NMOS transistor NM11, during an inversion procedure.

The variable inversion unit 130 may invert the ground voltage GND corresponding to a logical value of '0' to the power supply voltage VDD corresponding to a logical value of '1' according to the increased logical threshold value LTV, and may output the inverted voltage to the second node N2. The inverter 122 may invert a voltage of the second node N2, that is, the power supply voltage VDD to the ground voltage GND to output it to the third node N3. A voltage of the third node N3, that is, the ground voltage GND may be transferred to the first node N1 in response to a low level of the inverted pulse PSb. Accordingly, the first node N1 may latch a logical value of '0' corresponding to the ground voltage GND. The latched voltage may correspond to an output voltage Vout.

The latch circuit 100 may be configured to adjust the logical threshold value LTV by adjusting a ratio of a driving ability of PMOS transistors to a driving ability of NMOS transistors driven according to a changed logical value. Accordingly, a noise margin of the latch circuit 100 according to an exemplary embodiment of the inventive concept may increase by adjusting the logical threshold value LTV according to a changed logical value.

In one or more embodiments, the variable inversion unit 130 may include transistors PM13 and NM12, having gates connected with the first node N1, disposed between transistors PM12 and NM13 having gates connected with the third node N3.

Figure 3:
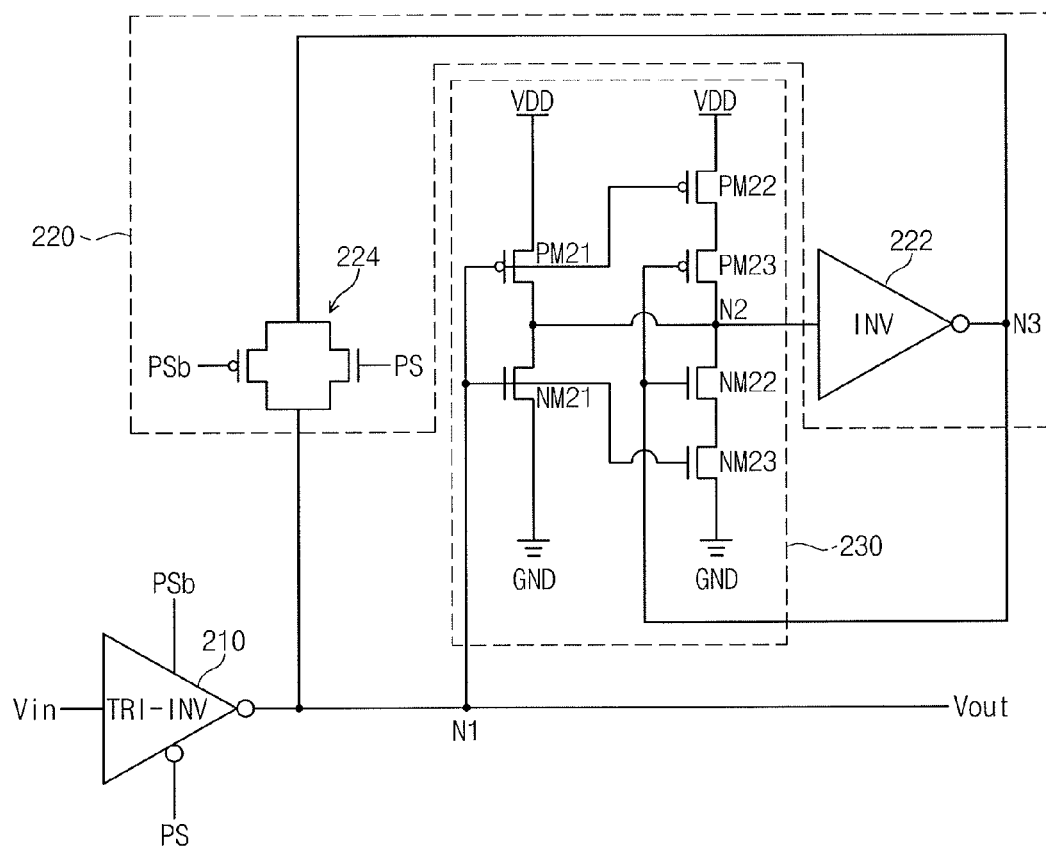
FIG. 3 illustrates a schematic diagram of another exemplary embodiment of a latch circuit.

FIG. 3 illustrates a diagram of another exemplary embodiment of a latch circuit 200. Referring to FIG. 3, the latch circuit 200 may include a first tri-state inverter 210, a second tri-state inverter 220, and a variable inversion unit 230. In general, only differences between the latch circuit 200 of FIG. 3 and the latch circuit 100 of FIG. 2 will be described below. The first and second tri-state inverters 210, 220 may be substantially identical to the first and second tri-state inverters 110, 120 in FIG. 2.

The variable inversion unit 230 of FIG. 3 may be different from the variable inversion unit 130 of FIG. 2 in that an order of stacked transistors is different. For example, the variable inversion unit 230 may include transistors PM23, NM22 having gates connected with the third node N3, disposed between transistors PM22, NM23 having gates connected with the first node N1.

In the exemplary embodiments of the variable inversion units 130, 230 of FIGS. 2 and 3, a plurality of PMOS transistors, e.g., two PMOS transistors PM12 and PM13 or PM22 and PM23 are stacked and a plurality of NMOS transistors, e.g., two NMOS transistors, NM12 and NM13 or NM22 and NM23, are stacked. In one or more embodiments, each of the variable inversion units 130 and 230 may be configured to include at least two stacked PMOS transistors and at least two stacked NMOS transistors. In one or more embodiments, at least one gate of the stacked PMOS transistors and at least one gate of the stacked NMOS transistors may be connected with the first node N1, and the other gates thereof may be connected with the third node N3.

Figure 4:
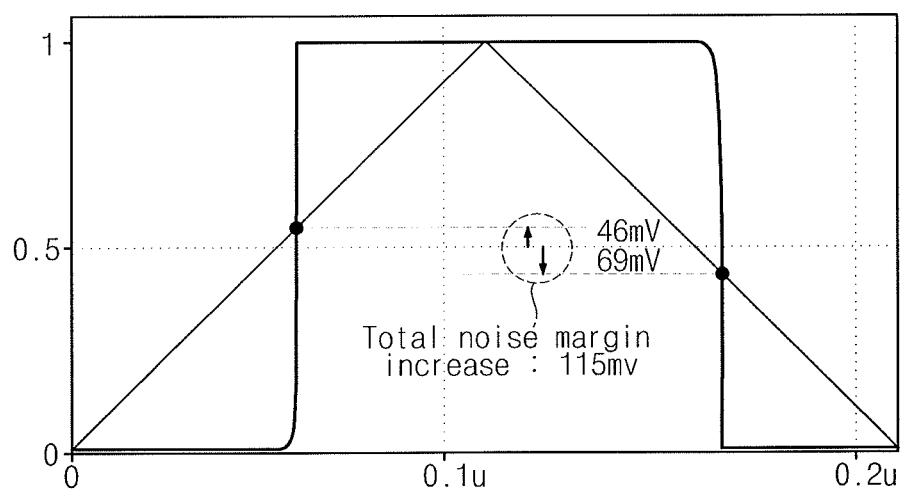
FIG. 4 illustrates a diagram of a noise characteristic of an exemplary embodiment of a latch circuit.

FIG. 4 illustrates a diagram of a noise characteristic of an exemplary embodiment of a latch circuit, e.g., 100, 200. Referring to FIG. 4, in one or more embodiments of a latch circuit, e.g., 100, 200, a noise margin may increase by 46 mV when a logical value is changed from '0' to '1' (during rising) and may decrease by 69 mV when a logical value is changed from '1' to '0' (during falling). Thus, referring to FIG. 4, in one or more embodiments, a noise margin of the latch circuit, e.g., 100, 200, may increase by a total of 115 mV.

Figure 5:
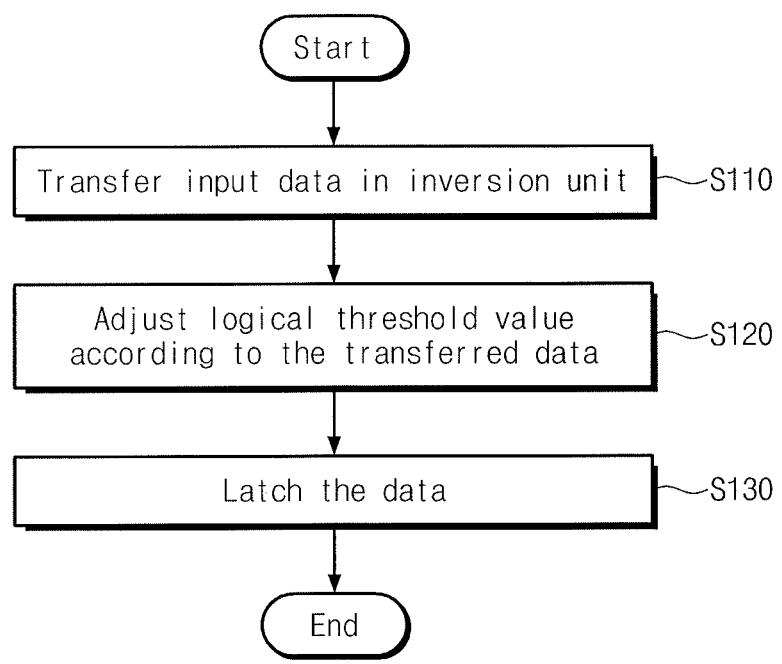
FIG. 5 illustrates a flowchart of an exemplary embodiment of a data latching method of a latch circuit.

FIG. 5 illustrates a flowchart of an exemplary embodiment of a data latching method of a latch circuit. For ease of description, the exemplary data latching method will be described in accordance with the latch circuit 100 of FIG. 2.

Referring to FIGS. 2 and 5, the first tri-state inverter 110 may invert input data in response to an inverted pulse PSb (S110). The inverted input data may be transferred to the variable inversion unit 130.

The variable inversion unit 130 may then adjust a logical threshold voltage LTV according to the input data (S120). For example, if the input data is '1', the logical threshold value LTV may be lowered. If the input data is '0', the logical threshold value LTV may be increased.

Afterwards, the variable inversion unit 130 may invert the input data according to the adjusted logical threshold value LTV. Herein, the inverted data may be inverted by the inverter 122 in FIG. 2. Data output from the inverter 122 may then be output to the first node N1 via a tri-state transmission gate 124 in response to the inverted pulse PSb (S130). That is, data may be latched.

In one or more embodiments of a data latching method of a latch circuit employing one or more features described herein, a latch operation may include adjusting/varying/deciding a logical threshold value LTV according to data transferred to the variable inversion unit 130. A noise margin may be improved by performing a latch operation using a suitable logical threshold value LTV based on changed data.

One or more embodiments of a latch circuit, e.g., 100, 200, may be applicable to a flip-flop.

Figure 6:
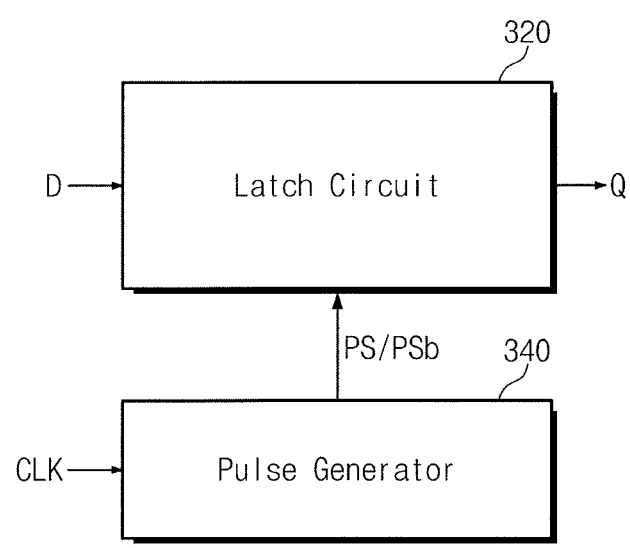
FIG. 6 illustrates a block diagram of an exemplary embodiment of a flip-flop.

FIG. 6 illustrates a block diagram of an exemplary embodiment of a flip-flop 300. Referring to FIG. 6, the flip-flop 300 may include a latch circuit 320 and a pulse generator 340.

The latch circuit 320 may generate an output signal Q by sampling an input signal D in response to a pulse PS/PSb. The latch circuit 320 may include, e.g., the latch circuit 100, 200 of FIGS. 2 and 3.

The pulse generator 340 may generate the pulse PS/PSb with a constant width in response to a clock CLK.

Figure 7:
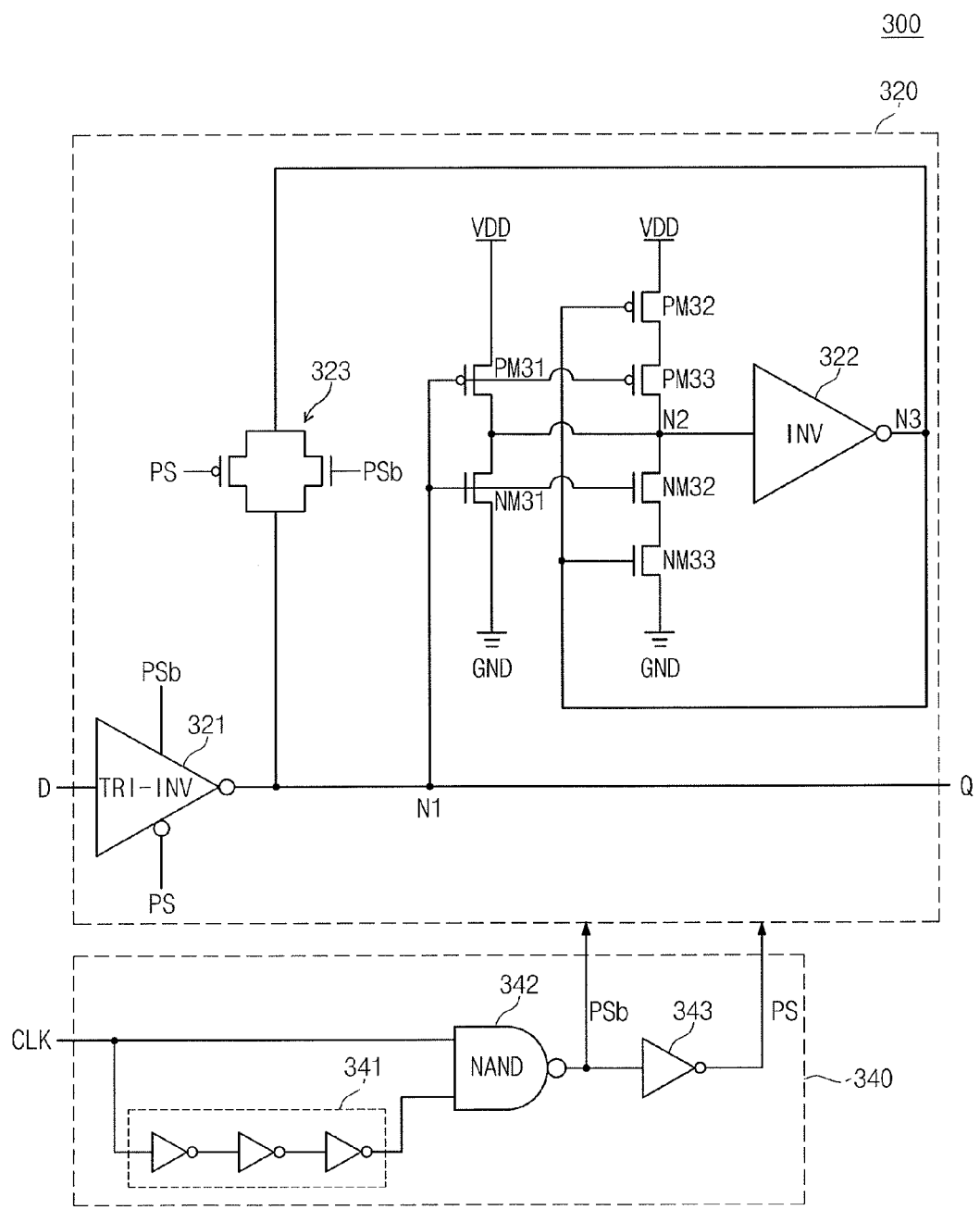
FIG. 7 illustrates a circuit diagram of the flip-flop in FIG. 6.

FIG. 7 illustrates a circuit diagram of the flip-flop 300 of FIG. 6. Referring to FIG. 7, the flip-flop 300 may include a latch circuit 320 and a pulse generator 340. The latch circuit 320 may include the latch circuit 100 and, thus, a description thereof will not be repeated.

The clock generator 340 may include a delay circuit 341, a logical circuit 342, and an inverter 343. The delay circuit 341 may include a plurality of inverters. In one or more embodiments, the delay circuit 341 may include an odd number of inverters. The delay circuit 341 may delay a clock CLK.

The logical circuit 342 may perform a NAND operation in response to the clock CLK and an output signal of the delay circuit 341. Herein, an output signal of the logical circuit 342 may be an inverted pulse PSb.

The inverter 343 may invert an output signal of the logical circuit 342. Herein, an output signal of the inverter 343 may be a pulse PS.

The pulses PS and PSb generated from the clock generator 340 may be provided to a tri-state inverter 321 and a tri-state transmission gate 323.

With one or more embodiments of the flip-flop 300 including a latch circuit, e.g., 100, 200, a nose margin may be adjusted, e.g., increased, by adjusting/varying/deciding a logical threshold value LTV according to input data D.

A latch circuit according to an exemplary embodiment of the inventive concept may be applicable to a master-slave flip-flop.

Figure 8:
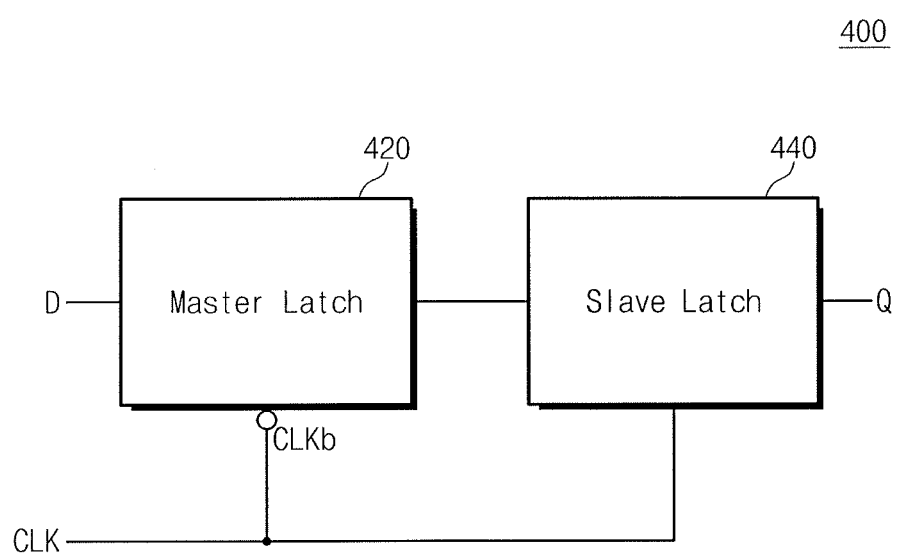
FIG. 8 illustrates a block diagram of an exemplary embodiment of a master-slave flip-flop.

FIG. 8 illustrates a block diagram of an exemplary embodiment of a master-slave flip-flop 400. Referring to FIG. 8, the master-slave flip-flop 400 may include a master latch circuit 420 and a slave latch circuit 440.

The master latch circuit 420 may latch input data D in response to an inverted version of a clock signal CLK.

The slave latch circuit 440 may latch an output signal of the master latch circuit 420 in response to the clock signal CLK. The slave latch circuit 440 may include a latch circuit including one or more features described herein, e.g., the latch circuits 100, 200.

Figure 9:
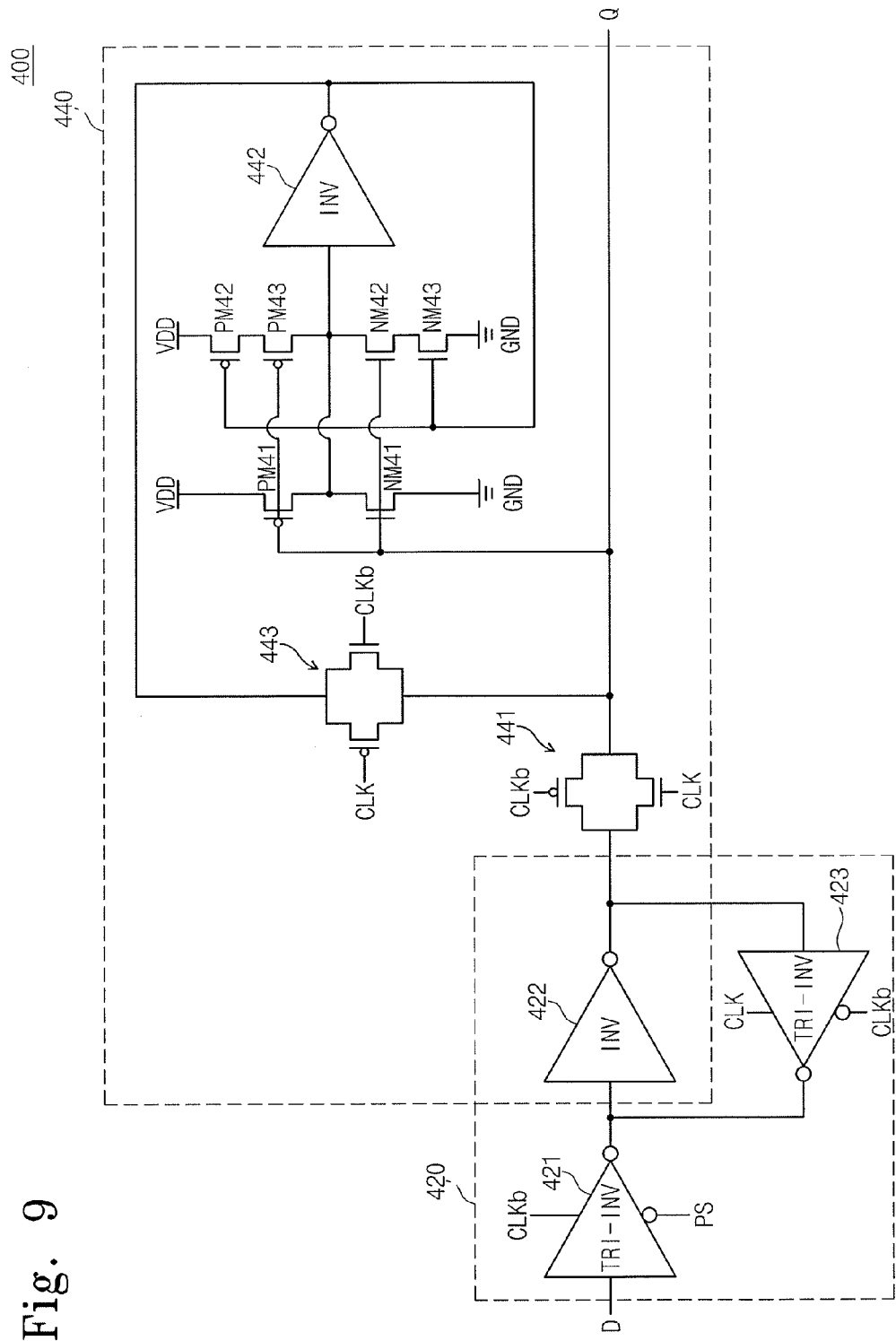
FIG. 9 illustrates a circuit diagram of the master-slave flip-flop of FIG. 8.

FIG. 9 illustrates a circuit diagram of an exemplary embodiment of the master-slave flip-flop 400 in FIG. 8.

Referring to FIG. 9, the master-slave flip-flop 400 may include a master latch circuit 420 and a slave latch circuit 440.

The master latch circuit 420 may include a first tri-state inverter 421, an inverter 422, and a second tri-state inverter 423.

When the first tri-state inverter 421 is turned on in response to an inverted clock CLKb, the second tri-state inverter 423 may be turned off. When the first tri-state inverter 421 is turned off in response to the inverted clock CLKb, the second tri-state inverter 423 may be turned on.

The master latch circuit 420 may latch an inverted version of input data D.

The slave latch circuit 440 may include a latch circuit including one or more features described herein, e.g., the latch circuit 100 of FIG. 2. Herein, the inverter 422 and a tri-state transmission gate 441 of the slave latch circuit 440 may correspond to the tri-state inverter 110 in FIG. 2. The slave latch circuit 440 may be identical to that 100 in FIG. 2, and description thereof will not be repeated.

One or more embodiments of the master-slave flip-flop 400 may perform a high-speed latch operation by employing a reduced number of devices and/or gates, e.g., by reducing an inverter, as compared a conventional master-slave flip-flop.

One or more embodiments of a flip-flop, e.g., 300, 400, including one or more features described herein may be applicable to an illegal command detecting circuit.

Figure 10:
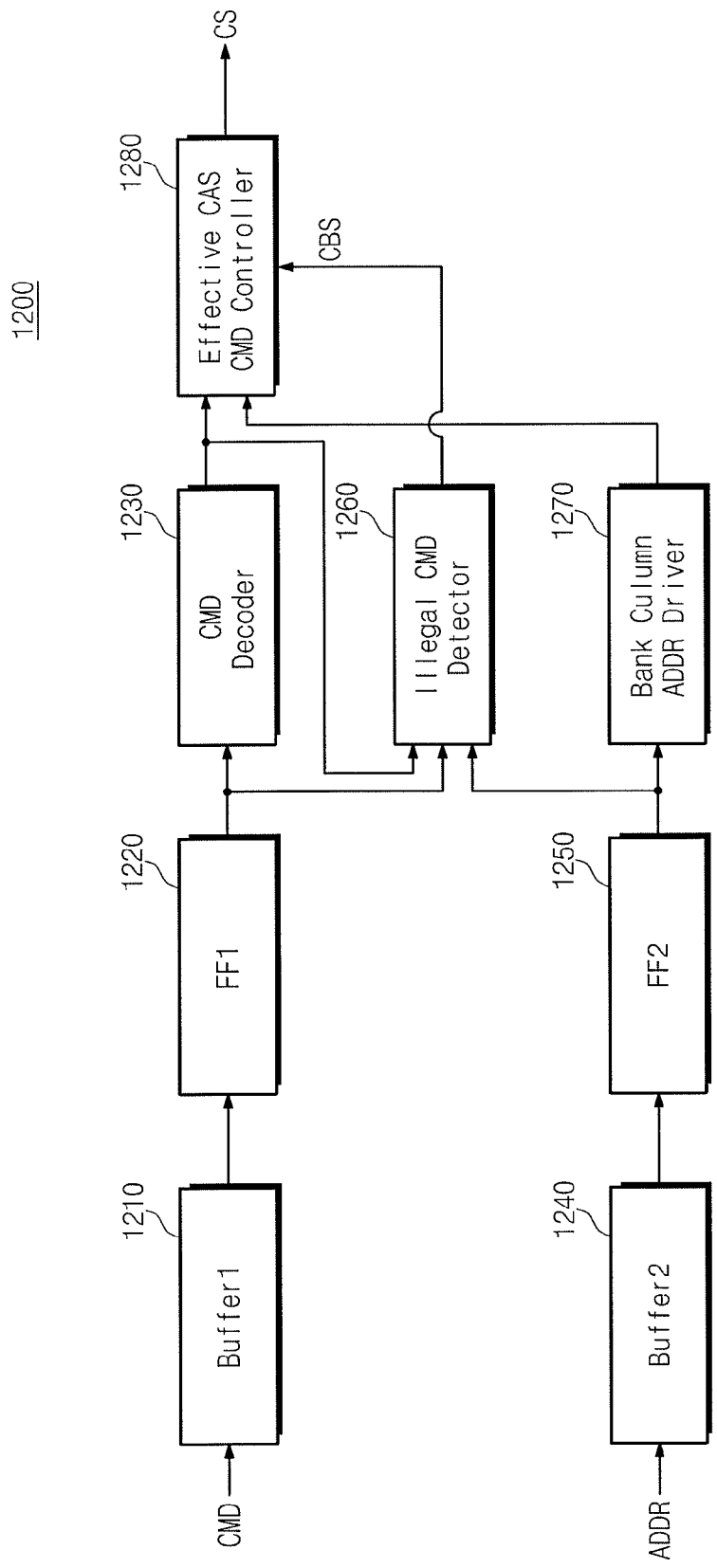
FIG. 10 illustrates a block diagram of an exemplary embodiment of an illegal command detecting circuit including a flip-flop employing one or more features described herein.

FIG. 10 illustrates a block diagram of an exemplary embodiment of an illegal command detecting circuit 1200 including a flip-flop employing one or more features described herein, e.g., 300, 400. Referring to FIG. 10, the illegal command detecting circuit 1200 may include the first input buffer 1210, the first flip-flop 1220, a command decoder 1230, the second input buffer 1240, the second flip-flop 1250, an illegal command detector 1260, a bank column address driver 1270, and an effective CAS command controller 1280. Each of the first and second flip-flops 1220, 1250 may include, e.g., the flip-flop 300 of FIG. 6 or the master-slave flip-flop 400 of FIG. 8.

The first input buffer 1210 may receive a command CMD. After being synchronized with a clock by the first input buffer 1210 and the first flip-flop 1220, the command CMD may be sent to the command decoder 1230 and the illegal command detector 1260 as an internal command input signal. The command decoder 1230 may decode the internal command input signal to transfer the decoded command to the effective CAS command controller 1280.

The second input buffer 1240 may receive an address ADDR. After being synchronized with the clock by the second input buffer 1240 and the second flip-flop 1250, the address ADDR may be sent to the bank column address driver 1270 and the illegal command detector 1260. The bank column address driver 1270 may transfer the input address ADDR to the effective CAS command controller 1280. The effective CAS command controller 1280 may output control signals (e.g., a column selection signal, etc.) necessary for an operation of a memory device in response to the decoded command and an address signal.

The illegal command detector 1260 may receive the internal command input signal and the address signal from the first and second flip-flops 1220 and 1250. The illegal command detector 1260 may receive a bank address signal (hereinafter, referred to as an active address signal) associated with a just previous active command from the command decoder 1230.

A storage unit (not shown) can be provided between an output of the command decoder 1230 and an input of the illegal command detector 1260 to temporarily store the active address signal.

The illegal command detector 1260 may judge whether the internal command input signal input from the first flip-flop 1220 is an illegal command, by comparing the address signal provided from the second flip-flop 1250 and the active address signal provided from the storage unit. The illegal command detector 1260 may generate a command blocking signal CBS indicating the judgment result. For example, if the internal command input signal is judged to be the illegal command, the command blocking signal CBS may be activated. If the internal command input signal is judged not to be the illegal command, the command blocking signal CBS may be inactivated.

The command blocking signal CBS generated from the illegal command detector 1260 may be provided to the effective CAS command controller 1280. The illegal command detector 1260 may be formed using a CMOS transistor, an OR gate, an inverter, etc.

The effective CAS command controller 1280 may receive output signals of the command decoder 1230 and the bank column address driver 1270 to generate an internal control signal CS. If the command blocking signal CBS is activated, an output of the effective CAS command controller 1280 may be interrupted.

Figure 11:
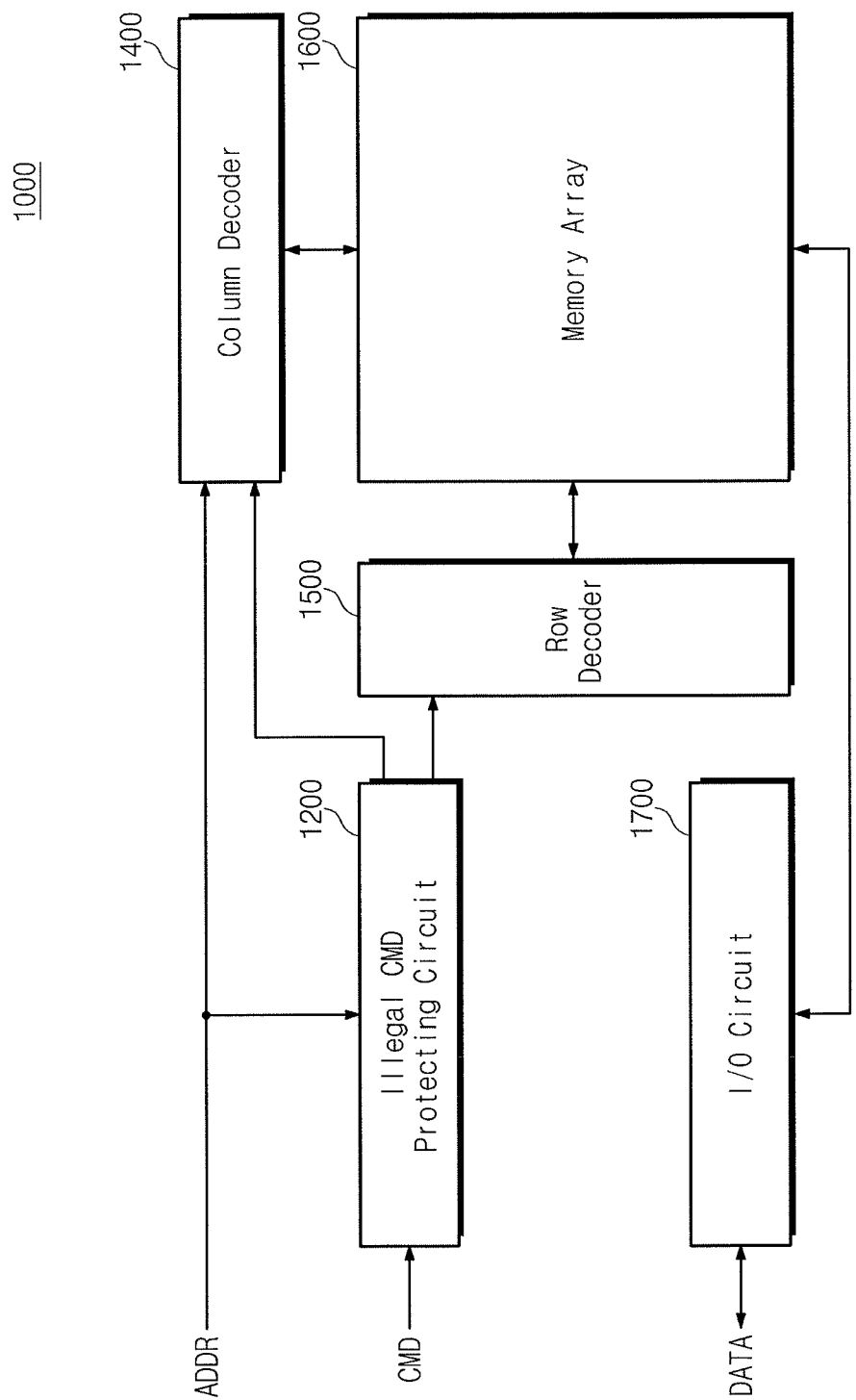
FIG. 11 illustrates a block diagram of an exemplary embodiment of a semiconductor memory device including the illegal command detecting circuit of FIG. 10.
Figure 12:
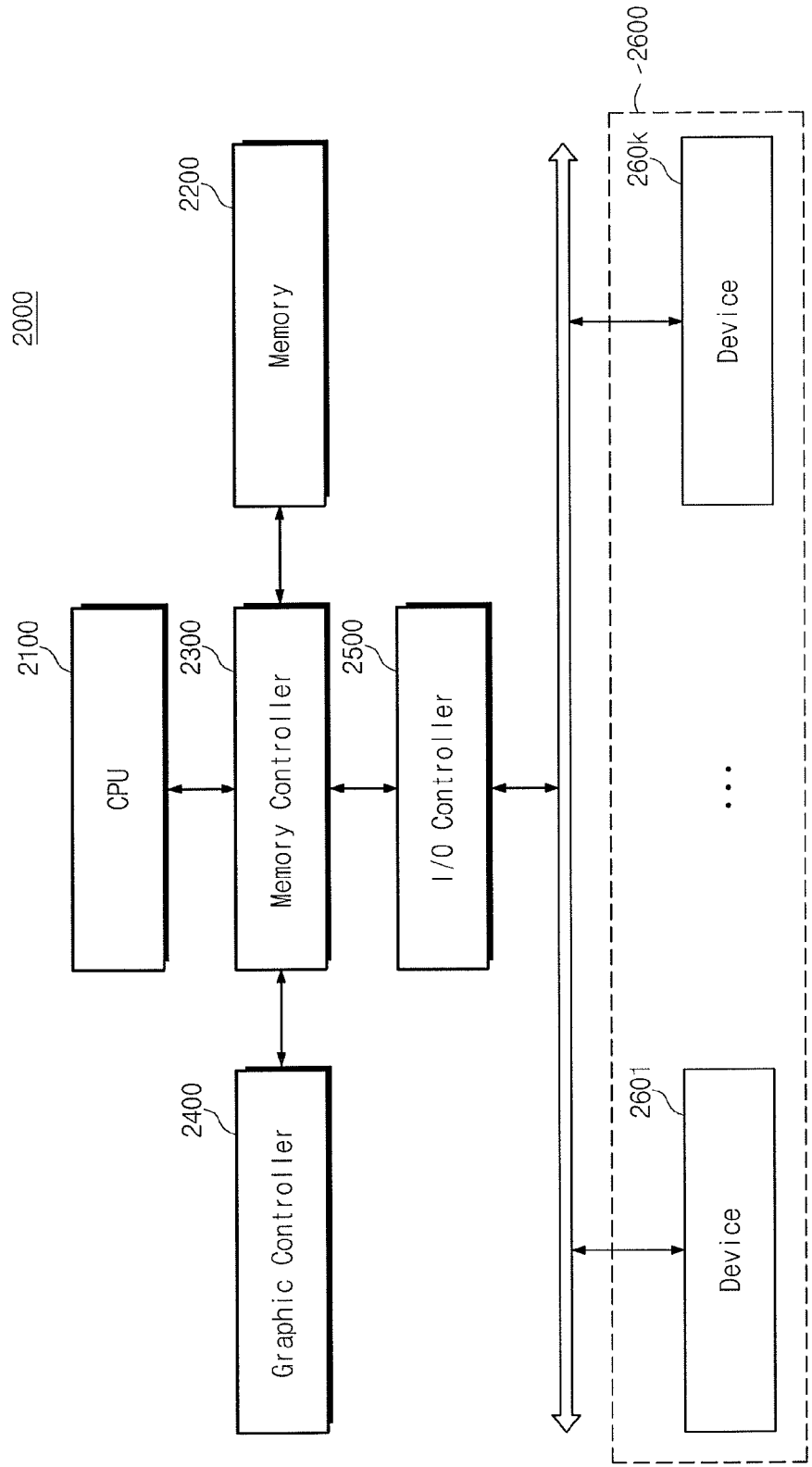
FIG. 12 illustrates a block diagram of an exemplary embodiment of a computer system including the semiconductor memory device of FIG. 11.

FIG. 11 illustrates a block diagram of an exemplary embodiment of a semiconductor memory device 1000 including the illegal command detecting circuit 1200 in FIG. 10. Referring to FIG. 12, the semiconductor memory device 1000 may include the illegal command preventing circuit 1200, a column decoder 1400, a row decoder 1500, a memory array 1600, and an input/output circuit 1700.

The column decoder 1400 may respond to a column address to output a column selection signal for selecting bit lines of the memory array 1600. The row decoder 1500 may activate a selected word line in response to a row address. The memory array 1600 may include a bit line sense/amplifier (not shown) connected with a bit line pair and a plurality of memory banks including memory cells (each being formed of a storage capacitor and an access transistor) arranged at intersections of word lines and bit lines, etc. The input/output circuit 1700 may temporarily store data at a write operation or a read operation.

FIG. 12 illustrates a block diagram of an exemplary embodiment of a computer system 2000 including the semiconductor memory device 1000 of FIG. 11. Referring to FIG. 12, the computer system 2000 may include a CPU 2100, a memory device 2200, a memory controller 2300, a graphic controller 2400, an input/output controller 2500, and a plurality of devices 2600.

The CPU 2100 may control an overall operation of the computer system 2000, and may execute a code loaded on the memory device 2200 to perform a command corresponding to the code. When performing such a command, the CPU 2100 may communicate with the constituent elements 2300, 2400, 2500, 2600 and may control them.

The memory device 2200 may store a code executed by the CPU 2100 and data associated with execution of an operation of the CPU 2100. The memory device 2200 may be a volatile memory such as DDR2/DDR3 SDRAM. The memory device 2200 may include the semiconductor memory device 1000 in FIG. 11.

The memory controller 2300 may communicate with the memory device 2200 to make an interface of writing and reading of data on the memory device 2200. The memory controller 2300 may transmit an address, a command, and data to the memory device 2200. The memory controller 2300 may receive a memory output signal from the memory device 2200 and may judge data loaded on the memory output signal based upon a level of the memory output signal. The memory controller 2300 may interface with other constituent elements for data writing and reading between the memory device 2200 and the other constituent elements.

The graphic controller 2400 may process graphic data.

The input/output controller 2500 may provide an interface between the CPU 2100 and the devices 2600. The memory controller 2300 and the input/output controller 2500 may be formed in a single chip or independently. The memory controller 2300 can be integrated with the CPU 2100.

The devices 260l to 260k may include a keyboard, a mouse, a tablet, a touch screen, a joystick, a webcam, an image scanner, a barcode reader, a sound card, a speaker, a microphone, a printer, CD-ROM, CD-R, CD-RW, DVD-ROM, DVD-R, DVDRW, USB drive, a modem, a network card, and the like.

The computer system 2000 may further include a printed circuit board (PCB) (not shown) named a mother board. The memory controller 2300 and/or the input/output controller 2500 may be mounted on the PCB. The PCB may include at least one of a plurality of slots (not shown) in which the memory device 2200, the memory controller 2300, and the devices 2600 can be inserted.

Figure 13:
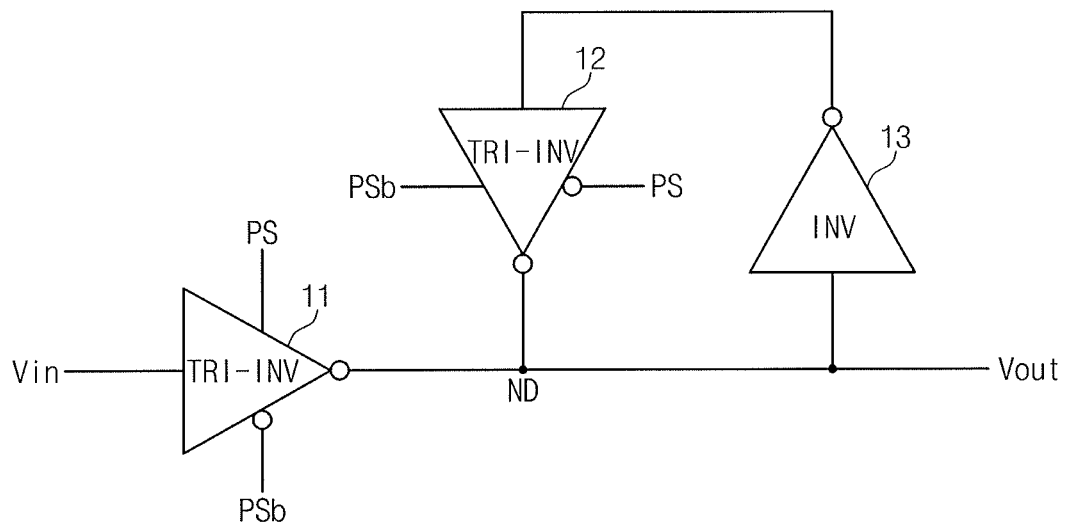
FIG. 13 illustrates a schematic diagram of a conventional latch circuit.

FIG. 13 illustrates a diagram of a general latch circuit. The latch circuit 10 includes a first tri-state inverter 11, a second tri-state inverter 12, and an inverter 13. The first tri-state inverter 11 may invert an input voltage Vin in response to a high level of a pulse PS, i.e., the first tri-state inverter 11 may be turned on when the pulse PS has a high level. The second tri-state inverter 12 may be turned on in response to a low level of the pulse PS. The inverter 13 may invert an output of the first tri-state inverter 11. The second tri-state inverter 12 may invert an output of the inverter 13 when the pulse PS has a low level (or, an inverted pulse PSb has a high level). At this time, the inverted signal may be an output voltage Vout. In the latch circuit 10, a closed loop may be formed when the second tri-state inverter 12 is turned off and the first tri-state inverter 11 is turned on, or when the first tri-state inverter 11 is turned off and the second tri-state inverter 12 is turned on. In this case, an output node ND may maintain a predetermined logical value ('1' or '0'). Herein, it is assumed that a logical value of '1' corresponds to a power supply voltage VDD and a logical value of '0' corresponds to a ground voltage GND. When the output node ND is subjected to noise, e.g., cross coupling noise, the latch circuit 10 may have a logical threshold value of VDD/2 (hereinafter, referred to as 'LTV') as a noise margin. The logical threshold value LTV may be the input voltage Vin for changing a logical value. That is, the logical threshold value LTV may be the input voltage Vin changed from a logical value of '1' to a logical value of '0' or from a logical value of '0' to a logical value of '1'.

In comparison to the general latch circuit 10 of FIG. 13, one or more embodiments of the latch circuit 100, 200 of FIGS. 2 and 3 may not employ the inverter 13.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the inventive concept.

Spatially relative terms, such as "beneath", "below", "lower", "under", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the exemplary terms "below" and "under" can encompass both an orientation of above and below. The device may be otherwise oriented (rotated 90 degrees or at other orientations) and the spatially relative descriptors used herein interpreted accordingly. In addition, it will also be understood that when a layer is referred to as being "between" two layers, it can be the only layer between the two layers, or one or more intervening layers may also be present.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items.

It will be understood that when an element or layer is referred to as being "on", "connected to", "coupled to", or "adjacent to" another element or layer, it can be directly on, connected, coupled, or adjacent to the other element or layer, or intervening elements or layers may be present. In contrast, when an element is referred to as being "directly on," "directly connected to", "directly coupled to", or "immediately adjacent to" another element or layer, there are no intervening elements or layers present.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

The above-disclosed subject matter is to be considered illustrative, and not restrictive, and the appended claims are intended to cover all such modifications, enhancements, and other embodiments, which fall within the true spirit and scope. Thus, to the maximum extent allowed by law, the scope is to be determined by the broadest permissible interpretation of the following claims and their equivalents, and shall not be restricted or limited by the foregoing detailed description.

What is claimed is:

1. A latch circuit, comprising:
a first tri-state inverter configured to invert an input voltage in response to a pulse and to output the inverted input voltage to a first node;
a second tri-state inverter connected between the first node and a second node and configured to invert a voltage of the second node in response to an inverted pulse, the inverted pulse being an inverted version of the pulse;
a variable inversion unit connected between the first node and the second node,
wherein the variable inversion unit is configured to adjust a logical threshold value according to a logical value corresponding to a voltage of the first node and to invert a voltage of the first node based on the adjusted logical threshold value, the logical threshold value indicating a voltage for discriminating the logical value.

2. The latch circuit as claimed in claim 1, wherein the second tri-state inverter is turned off when the first tri-state inverter is turned on, and the second tri-state inverter is turned on when the first tri-state inverter is turned off.

3. The latch circuit as claimed in claim 1, wherein the second tri-state inverter comprises:
an inverter connected between the second node and a third node and configured to invert a voltage of the second node; and
a tri-state transmission gate connected between the first node and the third node and configured to output a voltage of the third node to the first node in response to the inverted pulse.

4. The latch circuit as claimed in claim 1, wherein the logical threshold value is increased over a reference value when a voltage of the first node corresponds to a logical value of '0' and is lowered below the reference value when a voltage of the first node corresponds to a logical value of '1'.

5. The latch circuit as claimed in claim 4, wherein the reference value is half a power supply voltage.

6. The latch circuit as claimed in claim 1, wherein the variable inversion unit includes at least one PMOS transistor and at least one NMOS transistor, the at least one PMOS transistor and the at least one NMOS transistor being configured to invert the logical value, and
wherein the logical threshold value is adjusted according to a ratio of a driving ability of the at least one PMOS transistor to a driving ability of the at least one NMOS transistor.

7. The latch circuit as claimed in claim 6, wherein the variable inversion unit includes a first PMOS transistor and a first NMOS transistor connected in series between a power supply voltage and a ground voltage, the first PMOS transistor being connected between the power supply voltage and the second node, the first NMOS transistor being connected between the second node and the ground voltage, and gates of the first PMOS transistor and the first NMOS transistor being connected with the first node; and
a second PMOS transistor, a third PMOS transistor, a second NMOS transistor, and a third NMOS transistor connected in series between the power supply voltage and the ground voltage, the second and third PMOS transistors being connected in series between the power supply voltage and the second node, the second and third NMOS transistors being connected in series between the second node and the ground voltage, gates of the second PMOS transistor and the second NMOS transistor being connected with the first node, and gates of the third PMOS transistor and the third NMOS transistor being connected with the third node.

8. The latch circuit as claimed in claim 7, wherein channel widths of the first to third PMOS transistors are wider than those of the first to third NMOS transistors.

9. The latch circuit as claimed in claim 8, wherein the first PMOS transistor has a channel width of 0.24 µm, each of the second and third PMOS transistors has a channel width of 0.70 µm, the first NMOS transistor has a channel width of 0.12 µm, and each of the second and third NMOS transistors has a channel width of 0.35 µm.

10. The latch circuit as claimed in claim 8, wherein the inverter comprises:
   a PMOS transistor connected between the power supply voltage and the third node; and
   an NMOS transistor connected between the third node and the ground voltage, gates of the PMOS and NMOS transistors being connected with the first node, and the PMOS and NMOS transistors having the same channel width.

11. The latch circuit as claimed in claim 10, wherein each of the PMOS and NMOS transistors has a channel width of 0.12 μm.

12. The latch circuit as claimed in claim 6, wherein the variable inversion unit includes a first PMOS transistor and a first NMOS transistor connected in series between a power supply voltage and a ground voltage, the first PMOS transistor being connected between the power supply voltage and the second node, the first NMOS transistor being connected between the second node and the ground voltage, and gates of the first PMOS transistor and the first NMOS transistor being connected with the first node; and
   a second PMOS transistor, a third PMOS transistor, a second NMOS transistor, and a third NMOS transistor connected in series between the power supply voltage and the ground voltage, the second and third PMOS transistors being connected in series between the power supply voltage and the second node, the second and third NMOS transistors being connected in series between the second node and the ground voltage, gates of the second PMOS transistor and the second NMOS transistor being connected with the third node, and gates of the third PMOS transistor and the third NMOS transistor being connected with the first node.

13. A flip-flop, comprising:
   a clock generator configured to generate a pulse in response to a clock; and
   a latch circuit configured to latch input data in response to the pulse,
   wherein during a latch operation, the latch circuit adjusts a logical threshold value according to the input data and inverts the input data based upon the adjusted logical threshold value, the logical threshold value directing a voltage for discriminating the logical value.

14. The flip-flop as claimed in claim 13, wherein the latch circuit comprises:
   a first tri-state inverter configured to invert the input data in response to the pulse;
   a second tri-state inverter configured to invert an output of the first tri-state inverter in response to an inverted pulse being an inverted version of the pulse; and
   a variable inversion unit configured to adjust the logical threshold value according to the logical value corresponding to an output of the first tri-state inverter and to invert the logical value based upon the adjusted logical threshold value.

15. The flip-flop as claimed in claim 14, wherein the second tri-state inverter comprises:
   an inverter configured to invert an output of the variable inversion unit; and
   a tri-state transmission gate configured to output an output of the inverter in response to the inverted pulse.

16. The flip-flop as claimed in claim 15, wherein the variable inversion unit comprises:
   a first PMOS transistor connected between a power supply voltage and a second node;
   second and third PMOS transistors connected in series between the power supply voltage and the second node;
   a first NMOS transistor connected between the second node and a ground voltage; and
   second and third NMOS transistors connected in series between the second node and the ground voltage,
   wherein gates of the first PMOS transistor, the third PMOS transistor, the first NMOS transistor, and the second NMOS transistor are connected with the first node and gates of the second PMOS transistor and the third NMOS transistor are connected with a third node, and
   wherein the first node is an output terminal of the first tri-state inverter, the second node is an input terminal of the inverter, and the third node is an output terminal of the inverter.

17. The flip-flop as claimed in claim 15, wherein the variable inversion unit comprises:
   a first PMOS transistor connected between a power supply voltage and a second node;
   second and third PMOS transistors connected in series between the power supply voltage and the second node;
   a first NMOS transistor connected between the second node and a ground voltage; and
   second and third NMOS transistors connected in series between the second node and the ground voltage,
   wherein gates of the first PMOS transistor, the second PMOS transistor, the first NMOS transistor, and the third NMOS transistor are connected with the first node and gates of the third PMOS transistor and the second NMOS transistor are connected with a third node, and
   wherein the first node is an output terminal of the first tri-state inverter, the second node is an input terminal of the inverter, and the third node is an output terminal of the inverter.

18. The flip-flop as claimed in claim 13, wherein the clock generator comprises:
   a delay circuit configured to delay the clock and including a plurality of inverters the number of which is odd;
   a logical circuit configured to make a NAND operation on the clock and an output of the delay circuit; and
   an inverter configured to invert an output of the logical circuit,
   wherein an output of the logical circuit is the pulse.

19. A data latching method, comprising:
   receiving data;
   inverting the input data in response to a pulse;
   adjusting a logical threshold value according to the inverted data, the logical threshold voltage directing a voltage for discriminating the logical value.

20. The data latching method as claimed in claim 19, wherein adjusting the logical threshold value includes:
   increasing the logical threshold value over a reference value when the inverted data is '0'; and
   lowering the logical threshold value below the reference value when the inverted data is '1'.

* * * * *